United States Patent
Ma et al.

(10) Patent No.: US 8,211,775 B1
(45) Date of Patent: Jul. 3, 2012

(54) METHOD OF MAKING TRANSISTOR HAVING METAL GATE

(75) Inventors: Cheng-Yu Ma, Tainan (TW); Wen-Han Hung, Kaohsiung (TW); Ta-Kang Lo, Taoyuan County (TW); Tsai-Fu Chen, Hsinchu (TW); Tzyy-Ming Cheng, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/043,479

(22) Filed: Mar. 9, 2011

(51) Int. Cl.
*H01L 21/336* (2006.01)

(52) U.S. Cl. .......... 438/287; 438/763; 257/E21.444

(58) Field of Classification Search .......... 438/183, 438/184, 774, 926; 257/E21.4, E21.457, 257/E21.536
See application file for complete search history.

(56) References Cited

U.S. PATENT DOCUMENTS

| | | | |
|---|---|---|---|
| 5,319,319 A | 6/1994 | Kerth | |
| 5,892,282 A | 4/1999 | Hong | |
| 5,915,203 A | 6/1999 | Sengupta | |
| 6,025,627 A | 2/2000 | Forbes | |
| 6,043,157 A | 3/2000 | Gardner | |
| 6,093,590 A * | 7/2000 | Lou | 438/197 |
| 6,096,659 A | 8/2000 | Gardner | |
| 6,100,118 A | 8/2000 | Shih | |
| 6,251,761 B1 | 6/2001 | Rodder | |
| 6,291,282 B1 | 9/2001 | Wilk | |
| 6,303,418 B1 | 10/2001 | Cha | |
| 6,444,139 B1 | 9/2002 | Minamihaba | |
| 6,506,682 B1 | 1/2003 | Lee | |
| 6,514,827 B2 | 2/2003 | Kim | |
| 6,653,698 B2 | 11/2003 | Lee | |
| 6,696,345 B2 | 2/2004 | Chau | |
| 6,743,669 B1 | 6/2004 | Lin | |
| 6,790,719 B1 | 9/2004 | Adetutu | |
| 6,794,234 B2 | 9/2004 | Polishchuk | |
| 6,797,622 B2 | 9/2004 | Brask | |
| 6,806,146 B1 | 10/2004 | Brask | |
| 6,825,117 B2 | 11/2004 | Miller | |
| 6,864,163 B1 * | 3/2005 | Yu et al. | 438/585 |
| 6,867,084 B1 | 3/2005 | Chiu | |
| 6,872,627 B2 | 3/2005 | Chen | |
| 6,902,969 B2 | 6/2005 | Adetutu | |
| 6,924,184 B2 | 8/2005 | Cave | |
| 6,960,416 B2 | 11/2005 | Mui | |
| 7,045,428 B2 | 5/2006 | Brask | |
| 7,098,516 B2 | 8/2006 | Colombo | |
| 7,108,579 B2 | 9/2006 | Wada | |
| 7,112,486 B2 | 9/2006 | Cho | |
| 7,138,323 B2 | 11/2006 | Kavalieros | |
| 7,148,548 B2 | 12/2006 | Doczy | |
| 7,153,784 B2 | 12/2006 | Brask | |
| 7,157,378 B2 | 1/2007 | Brask | |
| 7,166,913 B2 | 1/2007 | Chinthakindi | |
| 7,196,010 B2 | 3/2007 | Park | |
| 7,208,361 B2 | 4/2007 | Shah | |

(Continued)

*Primary Examiner* — Cheung Lee
(74) *Attorney, Agent, or Firm* — Winston Hsu; Scott Margo

(57) ABSTRACT

A method for forming a transistor having a metal gate is provided. A substrate is provided first. A transistor is formed on the substrate. The transistor includes a high-k gate dielectric layer, an oxygen containing dielectric layer disposed on the high-k gate dielectric layer, and a dummy gate disposed on the oxygen containing dielectric layer. Then, the dummy gate and the patterned gate dielectric layer are removed. Lastly, a metal gate is formed and the metal gate directly contacts the high-k gate oxide.

14 Claims, 5 Drawing Sheets

U.S. PATENT DOCUMENTS

| | | |
|---|---|---|
| 7,217,611 B2 | 5/2007 | Kavalieros |
| 7,220,635 B2 | 5/2007 | Brask |
| 7,314,793 B2 | 1/2008 | Frohberg |
| 7,381,619 B2 | 6/2008 | Wang |
| 7,488,656 B2 | 2/2009 | Cartier |
| 7,517,746 B2 | 4/2009 | Lin |
| 2002/0058374 A1* | 5/2002 | Kim et al. .................. 438/228 |
| 2003/0003645 A1 | 1/2003 | Besser |
| 2005/0239273 A1 | 10/2005 | Yang |
| 2005/0253173 A1 | 11/2005 | Wang |
| 2005/0275035 A1 | 12/2005 | Mathew |
| 2006/0001095 A1 | 1/2006 | Doris |
| 2006/0024953 A1 | 2/2006 | Papa Rao |
| 2006/0102964 A1 | 5/2006 | Huang |
| 2007/0037335 A1 | 2/2007 | Chambers |
| 2007/0138559 A1 | 6/2007 | Bohr |
| 2007/0145591 A1 | 6/2007 | Yano |
| 2007/0259519 A1 | 11/2007 | Yang |
| 2007/0262451 A1 | 11/2007 | Rachmady |
| 2008/0029478 A1 | 2/2008 | Hsu |
| 2008/0311713 A1 | 12/2008 | Lu |
| 2009/0039433 A1* | 2/2009 | Yang et al. .................. 257/365 |
| 2009/0057769 A1 | 3/2009 | Wei |
| 2009/0057787 A1 | 3/2009 | Matsuki |
| 2009/0101989 A1 | 4/2009 | Chen |
| 2009/0134466 A1 | 5/2009 | Cho |
| 2009/0166769 A1 | 7/2009 | Metz |
| 2009/0186458 A1 | 7/2009 | Yu |
| 2010/0062592 A1 | 3/2010 | Clark |
| 2010/0065926 A1 | 3/2010 | Yeh |
| 2010/0068877 A1 | 3/2010 | Yeh |

* cited by examiner

METHOD OF MAKING TRANSISTOR HAVING METAL GATE

BACKGROUND OF THE INVENTION

1. Field of the Invention

The present invention relates to a method for making a transistor having a metal gate, and more particularly, to a method of using an oxide layer as an etch stop layer when removing the dummy gate.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

SUMMARY OF THE INVENTION

The present invention therefore provides a method for making a transistor having a metal gate to avoid the oxygen vacancies phenomenon and provide a better work function tuning capability for the transistor.

According one preferred embodiment of the present invention, a method for making a metal gate is provided. A substrate is provided and a transistor is formed on the substrate. The transistor includes a high-k gate dielectric layer, an oxygen containing dielectric layer disposed on the high-k gate dielectric layer, and a dummy gate disposed on the oxygen containing dielectric layer. Then, the dummy gate and the oxygen containing dielectric layer are removed. Lastly, a metal gate is formed and the metal gate directly contacts the high-k gate dielectric layer.

In the present invention, the oxygen containing dielectric layer is utilized as an etch stop layer when removing the dummy gate. The oxygen containing dielectric layer can prevent the high-k gate dielectric layer from experiencing the oxygen vacancies phenomenon during the high temperature annealing process. Moreover, the oxygen containing dielectric layer can be removed in the subsequent steps so the metal gate can directly contact the high-k gate dielectric layer. Consequently, a transistor with good performance can be obtained.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
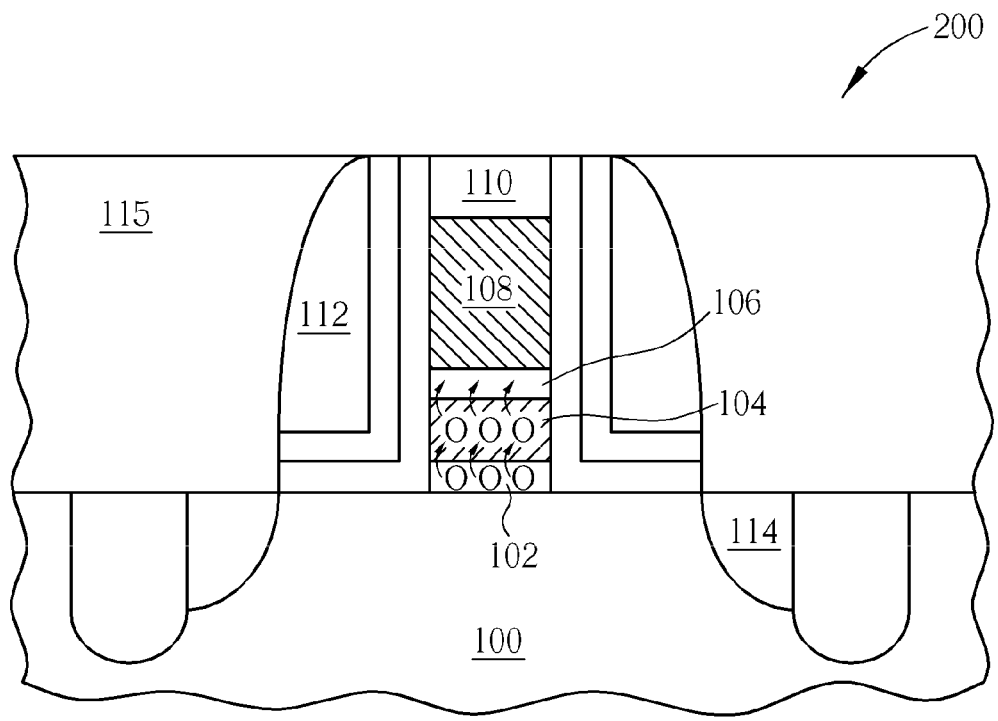
FIG. 1 to FIG. 3 illustrate schematic diagrams of a method for forming a transistor with a metal gate according to the first embodiment of the present invention.
Figure 2:
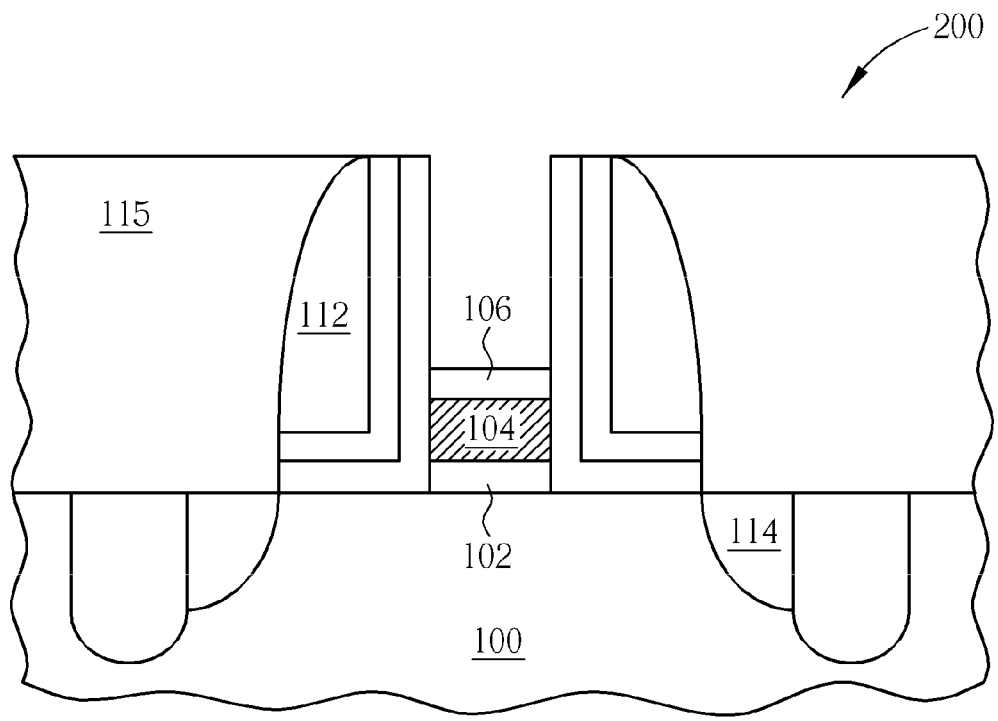
Figure 3:
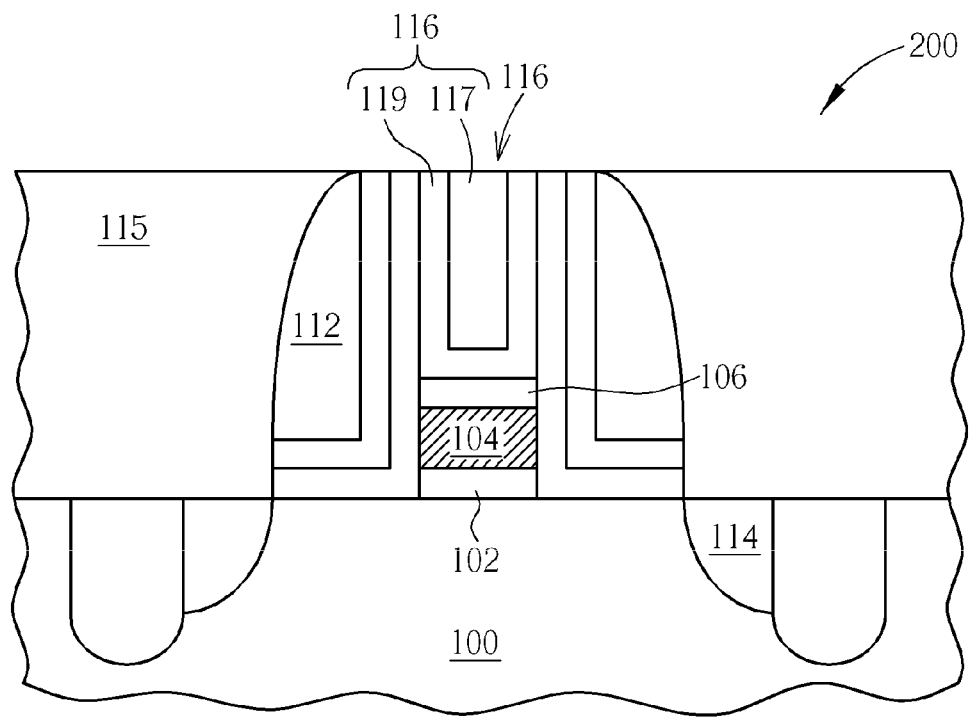

Please refer to FIG. 1 to FIG. 3, illustrating schematic diagrams of a method for forming a semiconductor device with a metal gate according to the first embodiment of the present invention. As shown in FIG. 1, a transistor 200 is formed on the substrate 100. The substrate 100 may be a silicon substrate, a silicon-containing substrate or a silicon-on-insulator (SOI) substrate. The transistor 200 includes an interface gate dielectric layer 102, a high-k dielectric layer 104, a metal layer 106, a dummy gate 108, a capping layer 110, a spacer 112 and a source/drain 114. The interface gate dielectric layer 102 can increase the adhesion ability of the above high-k dielectric layer 104. The material of the interface layer 102 may be silicon dioxide or nitridation silicon dioxide. The high-k dielectric layer 104 may include a single-layer or a multi-layer structure containing metal oxide layer such as rare earth metal oxide wherein the dielectric constant thereof is substantially greater than 20. For example, the high-k dielectric layer 104 may include hafnium oxide ($HfO_2$), hafnium silicon oxide (HfSiO), hafnium silicon oxynitride (HfSiON), aluminum oxide (MO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST). The metal layer 106 includes TiN, TaN or Ti/TiN, but is not limited thereto. The dummy gate 108 includes poly-silicon. In another embodiment, the dummy gate 108 is a multi-layered structure including a poly-silicon layer, an amorphous silicon layer or a germanium layer. The capping layer 110 can be a SiN layer. The spacer 112 can be a mono-layered structure or a multilayered structure including high temperature oxide (HTO), SiN, SiO, SiON or SiN formed by hexachlorodisilane ($Si_2Cl_6$) (HCD-SiN). Then, an ILD layer 115 is formed on the transistor 100. As shown in FIG. 2, the capping layer 110 and the dummy gate 108 are removed away when using the metal layer 106 as the etch stop layer. As shown in FIG. 3, the metal gate 116 is filled to form a transistor 200 having a metal gate 116. The metal gate 116 includes a work function metal layer 117 having a U-shaped cross-section and a metal layer 119. If the transistor 200 is an N-type transistor, the work function metal layer 117 can be TiAl, ZrAl, WAl, TaAl or HfAl, but is not limited thereto. If the transistor 200 is a P type transistor, the work function metal layer 117 can be TiN or TiC, but is not limited thereto. The metal layer 119 can be Al, Ti, Ta, W, Nb, Mo, TiN, TiC, TaN, Ti/W or Ti/TiN, but is not limited thereto.

However, the high-k dielectric layer 104 is formed before removing the dummy gate 108, so the high-k dielectric layer 104 will be subjected to normal MOS transistor manufacturing methods, such as some high temperature annealing processes, which would damage the high-k dielectric layer 104. As shown in FIG. 1, the high-k dielectric layer 104 is adjacent to the metal layer 106. When a high temperature annealing process, for example, an annealing process to activate the source/drain 114, is applied, the metal layer 106 will capture the oxygen from the high-k dielectric layer 104, leading to oxygen vacancies phenomenon. This will affect quality of the high-k dielectric layer 104, and also makes flat band voltage (Vfb) roll off. Furthermore, the metal layer 106 is not etched away after removing the dummy gate 108. When filling the metal gate 116, the metal gate 116 would directly contact the metal layer 106 and the work function capability of the metal gate 116 would be affected, thus decreasing the performance of the transistor 200.

Figure 4:
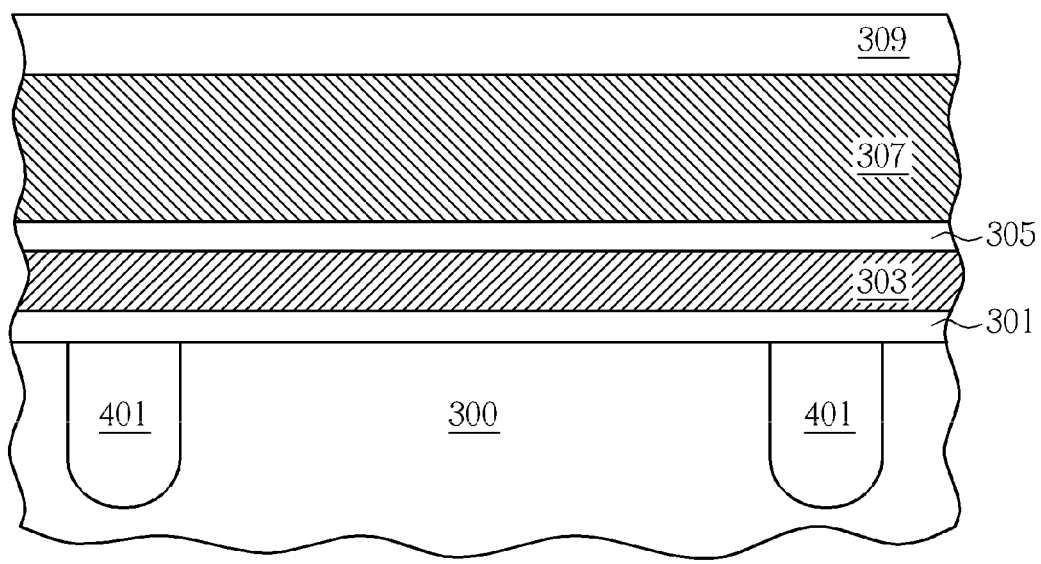
FIG. 4 to FIG. 10 illustrate schematic diagrams of method for forming a transistor with a metal gate according to the second embodiment of the present invention.

Please refer to FIG. 4 to FIG. 10, illustrating schematic diagrams of method for forming a transistor having a metal gate according to the second embodiment in the present invention. As shown in FIG. 4, a substrate 300 is provided, such as a silicon substrate, a silicon-containing substrate or a silicon-on-insulator (SOI) substrate. A plurality of shallow trench isolation (STI) 401 structures are then formed on the substrate 300.

Next, an interface layer 301, a high-k dielectric layer 303, an oxide layer 305, a dummy gate layer 307 and a capping layer 309 are in sequence deposited on the substrate 300. The deposition method may include a variety of deposition techniques, such as a chemical vapor deposition (VCD) or a physical vapor deposition (PVD), but is not limited thereto. The interface layer 301 can increase the adhesion ability of the above high-k dielectric layer 303. The material of the interface layer 301 may be silicon dioxide or nitridation silicon dioxide. In another embodiment, the interface layer 301 can be formed on the substrate 300 by an oxidation process. The high-k dielectric layer 303 may include a single-layer or a multi-layer structure containing metal oxide layer such as rare earth metal oxide wherein the dielectric constant thereof is substantially greater than 20. For example, the high-k dielectric layer 303 may include hafnium oxide ($HfO_2$), hafnium silicon oxide (HfSiO), hafnium silicon oxynitride (HfSiON), aluminum oxide (MO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST). The dielectric constant of high-k dielectric layer 303 is greater than that of the oxide layer 305 which is substantially between 4 and 15. The oxide layer 305 includes a variety of oxide materials, such as $SiO_2$. In another embodiment of the present invention, the oxide layer 305 may include fluoride oxide or nitrogen oxide, such as SiOF or SiON. The dummy gate layer 307 includes poly-silicon. In another embodiment, the dummy gate layer 307 is a multi-layered structure including a poly-silicon layer, an amorphous silicon layer or a germanium layer. The capping layer 309 can be a SiN layer.

Figure 5:
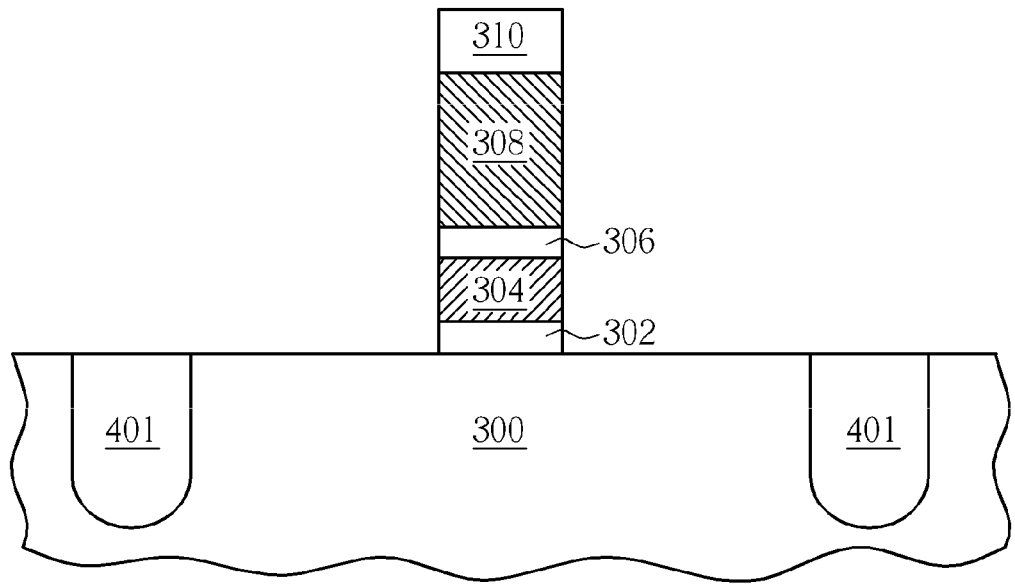
Figure 6:
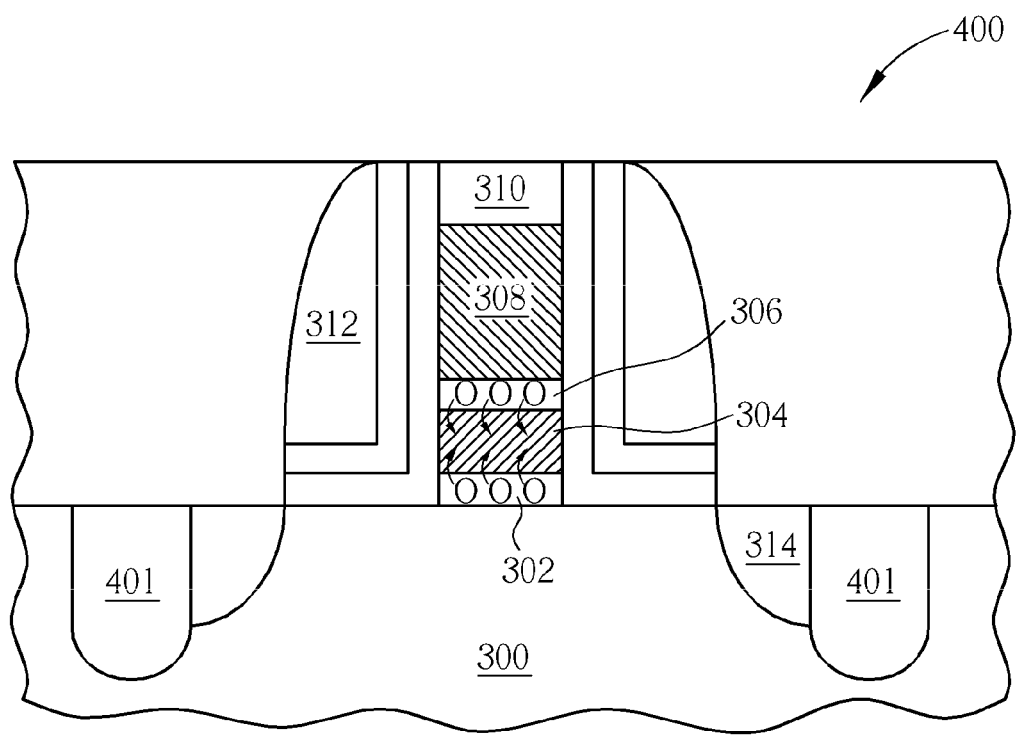

As shown in FIG. 5, by performing one or a plurality of photo-etching processes to pattern the interface layer 301, the high-k dielectric layer 303, the oxide layer 305, the dummy gate layer 307 and the capping layer 309, an interface gate dielectric layer 302, a high-k gate dielectric layer 304, a oxygen containing dielectric layer 306, a dummy gate 308 and a patterned capping layer 310 are respectively formed, thereby forming a gate stack structure. Subsequently, as shown in FIG. 6, a spacer 312 is formed on the sidewall of the interface gate dielectric layer 302, the high-k gate dielectric layer 304, the oxygen containing dielectric layer 306, the dummy gate 308 and the patterned capping layer 310. The spacer 312 can be a monolayered structure or a multilayered structure including high temperature oxide (HTO), SiN, SiO or SiN formed by hexachlorodisilane ($Si_2Cl_6$) (HCD-SiN). The method for forming the sidewall 312 is well known in the art and is not described in detail. Then, an implant process is performed to form a source/drain 314 in the substrate 300 by using the sidewall 312 and the gate stack structure as a mask. Then, an annealing process is carried out to activate the source/drain 314. It is noted that temperature of the source/drain 314 annealing process is usually greater than 1000 degrees, which may lead to oxygen vacancies phenomenon of the high-k gate dielectric layer 304 in the first embodiment (please see FIG. 1). In the present embodiment, the high-k gate dielectric layer 304 directly contacts the oxygen containing dielectric layer 306 and the interface gate dielectric layer 302 which is made of silicon dioxide. There is no metal layer disposed between the dummy gate 308 and the high-k gate dielectric layer 304. During the annealing process, the oxygen atom in the high-k gate dielectric layer 304 will not escape away. Conversely, the oxygen atom can be supplied by the interface gate dielectric layer 302 and the oxygen containing dielectric layer 306. Therefore, the oxygen vacancies phenomenon of the high-k dielectric gate layer 302 can be prevented. Similarly, the above effect can also work in other high temperature processes such as a silicide formation process.

In addition, the transistor 400 can further include other semiconductor structures which are not explicitly shown in FIG. 6, such as a light doped drain (LDD), a silicide layer, a source/drain having an hexagon (also called sigma $\Sigma$) or octagon shaped cross-section which is formed by selective epitaxial growth (SEG), or other protective films. In another embodiment, after forming the source/drain 314 or the silicide, the spacer 312 can be partially or completely removed to produce a desired stress of the contact etch stop layer (CESL) 316 toward the transistor 400.

Figure 7:
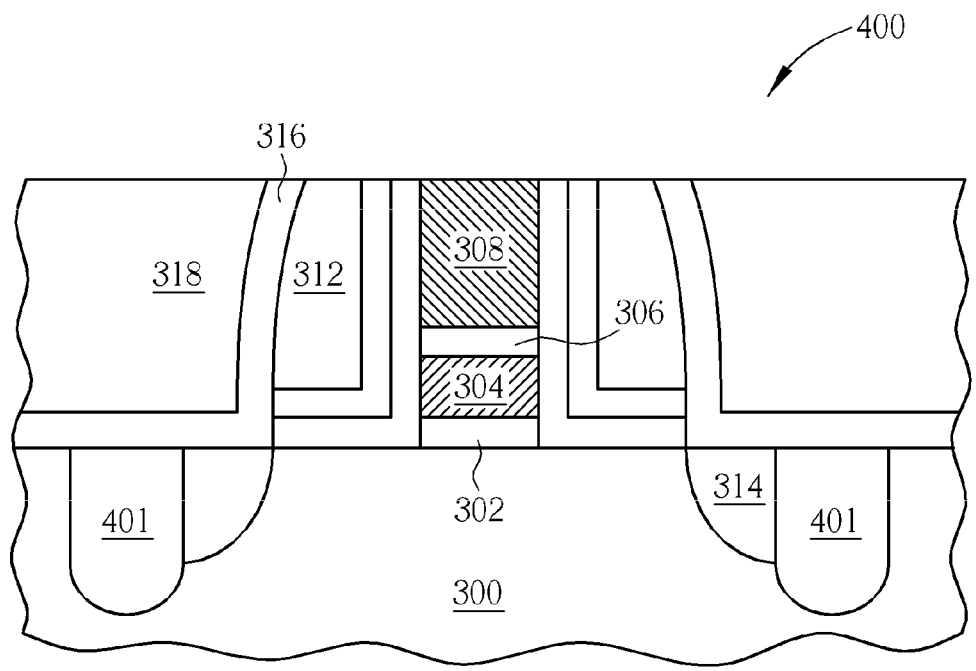

As shown in FIG. 7, after forming the transistor 400, a contact etch stop layer (CESL) 316 and an inter-layer dielectric (ILD) layer 318 are formed on the substrate 300 to cover the transistor 400. In one embodiment, the CESL 316 can generate a stress to form a selective strain scheme (SSS). Then, a planarization process, such as a chemical mechanical polish (CMP) process or an etching-back process is performed to remove a part of the ILD layer 318, a part of the CESL 316, a part of the spacer 312, and completely remove the patterned capping layer 310, until the top surface of the dummy gate 308 is exposed.

Figure 8:
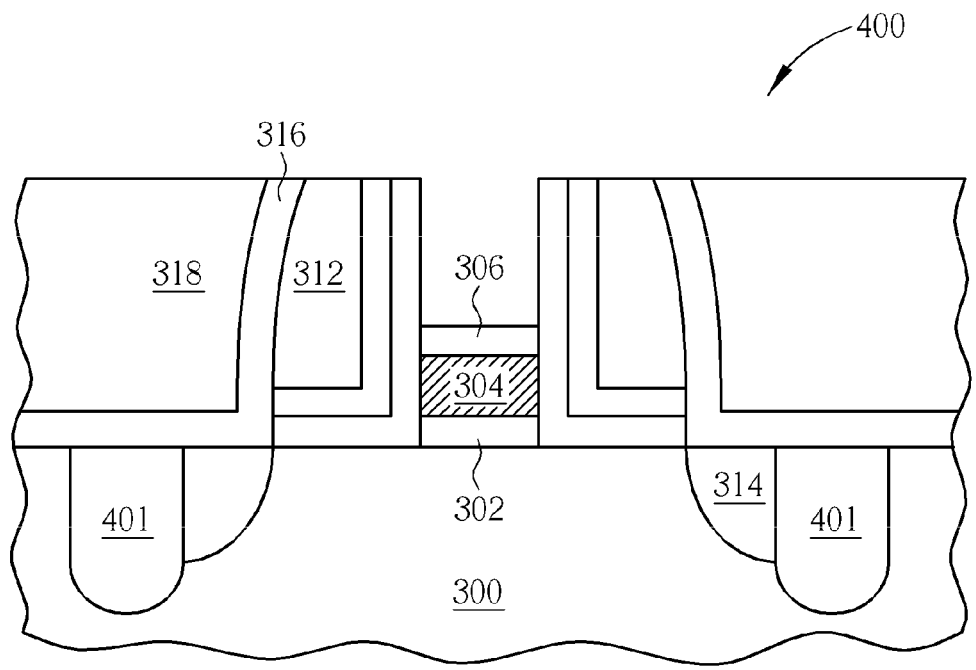

As shown in FIG. 8, the dummy gate 308 is removed. The removing method includes a wet etching process, for example, by using a hydroxide solution. Since the oxygen containing dielectric layer 306 has a good etching ratio with respect to the dummy gate 308 which is made of poly-silicon, the oxygen containing dielectric layer 306 can act as a good etch stop layer. The etching process toward the dummy gate 308 is therefore stopped on the oxygen containing dielectric layer 306.

Figure 9:
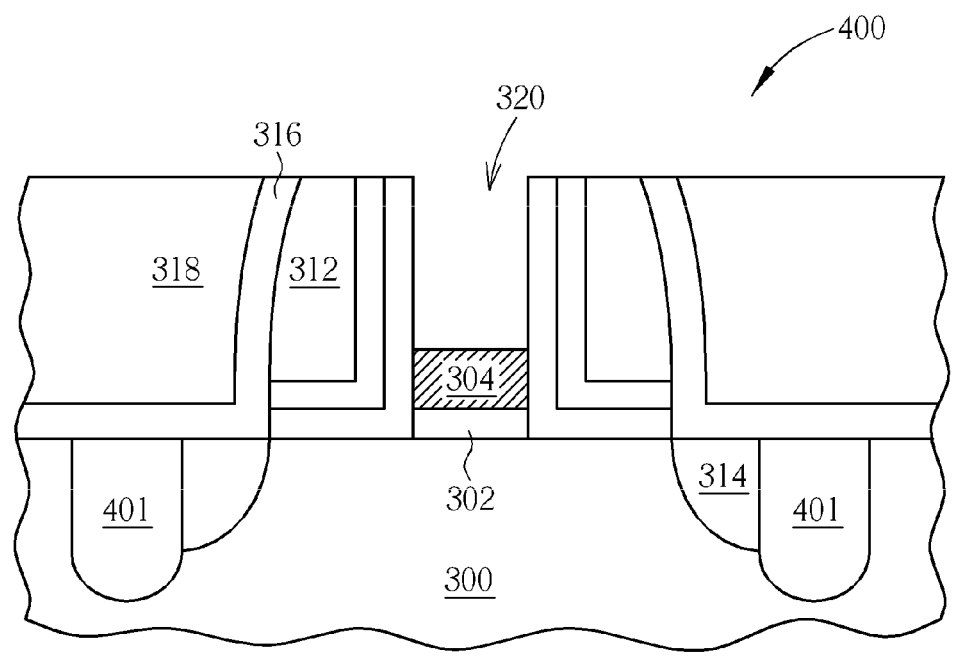

Next, as shown in FIG. 9, the oxygen containing dielectric layer 306 on the high-k gate dielectric layer 304 is removed. The removing method includes a dry etching, for example, by using a HF gas to remove the oxygen containing dielectric layer 306. In another embodiment of the present invention, the dummy gate 308 and the oxygen containing dielectric layer 306 can be removed in one etching process. After removing the dummy gate 308 and the oxygen containing dielectric layer 306, a trench 320 is formed in the transistor 400.

Figure 10:
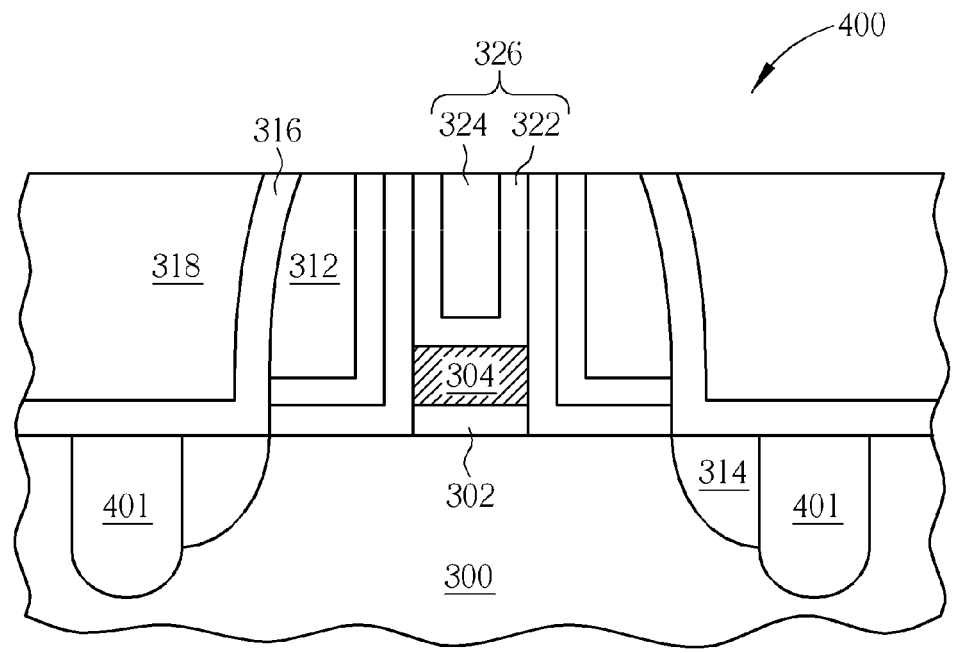

As shown in FIG. 10, according to the conductive type of the transistor 400, appropriate metal is filled into the trench 320 to form a gate metal 326. The metal gate 326 includes a work function metal layer 322 and a metal layer 326. If the transistor 400 is an N-type transistor, the work function metal layer 322 can be TiAl, ZrAl, WAl, TaAl or HfAl, but is not limited thereto. If the transistor 400 is a P type transistor, the work function metal layer 322 can be TiN or TiC, but is not limited thereto. The metal layer 324 can be Al, Ti, Ta, W, Nb, Mo, TiN, TiC, TaN, Ti/W or Ti/TiN, but is not limited thereto.

It is one salient feature that the oxygen containing dielectric layer 306 has been removed away, so the metal gate 326 in the trench 320 can directly contact the high-k gate dielectric layer 304. Compared to the first embodiment (FIG. 3), which has a metal layer 106 between the metal gate 116 and the high-k gate dielectric layer 104, the transistor 400 in the present embodiment can have better work function tuning capability.

In summary, the present invention provides a method for forming a transistor having a metal gate. The oxygen containing dielectric layer is utilized as an etch stop layer when removing the dummy gate. The oxygen containing dielectric layer can prevent the high-k gate dielectric layer from the oxygen vacancies phenomenon during the high temperature annealing process. Moreover, the oxygen containing dielectric layer can be removed in the subsequent steps so the metal gate can directly contact the high-k gate dielectric layer. Consequently, a transistor with good performance can be obtained.

Those skilled in the art will readily observe that numerous modifications and alterations of the device and method may be made while retaining the teachings of the invention.

What is claimed is:

1. A method for forming a transistor having a metal gate, comprising:
   providing a substrate;
   forming a transistor on the substrate, wherein the transistor comprises a high-k gate dielectric layer, an oxygen containing dielectric layer disposed on and directly contacting the high-k gate dielectric layer and a dummy gate disposed on the oxygen containing dielectric layer;
   removing the dummy gate and the oxygen containing dielectric layer on the high-k gate dielectric layer; and
   forming a metal gate, wherein the metal gate directly contacts the high-k gate dielectric layer.

2. The method for forming a transistor having a metal gate according to claim 1, wherein the oxygen containing dielectric layer comprises $SiO_2$, SiOF or SiON.

3. The method for forming a transistor having a metal gate according to claim 1, wherein in the step of forming the transistor, there is no metal layer between the dummy gate and the high-k gate dielectric layer.

4. The method for forming a transistor having a metal gate according to claim 1, wherein the dummy gate is removed first, and then the oxygen containing dielectric layer is removed.

5. The method for forming a transistor having a metal gate according to claim 4, wherein the step of removing the dummy gate comprises a wet etching step.

6. The method for forming a transistor having a metal gate according to claim 4, wherein the step of removing the oxygen containing dielectric layer comprises a dry etching step.

7. The method for forming a transistor having a metal gate according to claim 1, wherein the high-k gate dielectric layer is a metal oxide layer.

8. The method for forming a transistor having a metal gate according to claim 7, wherein the metal comprises rare earth metal.

9. The method for forming a transistor having a metal gate according to claim 7, wherein the high-k gate dielectric layer comprises hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST).

10. The method for forming a transistor having a metal gate according to claim 1, wherein the transistor further comprises an interface gate dielectric layer disposed between the substrate and the high-k gate dielectric layer and the interface gate dielectric layer directly contacts the high-k gate dielectric layer.

11. The method for forming a transistor having a metal gate according to claim 10, wherein the interface gate dielectric layer comprises silicon oxide or nitradation silicon oxide.

12. The method for forming a transistor having a metal gate according to claim 10, wherein the step of forming the transistor comprises:
    forming an interface layer, a high-k dielectric layer, an oxide layer and a dummy gate layer on the substrate in sequence; and
    performing a patterning process to form the interface gate dielectric layer, the high-k gate dielectric layer, the oxygen containing dielectric layer and the dummy gate.

13. The method for forming a transistor having a metal gate according to claim 12, wherein the step of forming the transistor further comprises:
    forming a spacer on a sidewall of the interface gate dielectric layer, the high-k gate dielectric layer, the oxygen containing dielectric layer and the dummy gate;
    performing an implant process by using the spacer as a mask to form a source/drain in the substrate; and
    performing a source/drain annealing process.

14. The method for forming a transistor having a metal gate according to claim 13, wherein the source/drain annealing process is performed above 1000 degrees.

* * * * *